(12) United States Patent
Yang

(10) Patent No.: US 7,560,944 B2
(45) Date of Patent: Jul. 14, 2009

(54) DIFFERENTIAL MEASUREMENT PROBE HAVING A GROUND CLIP SYSTEM FOR THE PROBING TIPS

(75) Inventor: Kei-Wean C. Yang, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 12/196,226

(22) Filed: Aug. 21, 2008

(65) Prior Publication Data

US 2008/0309356 A1    Dec. 18, 2008

Related U.S. Application Data

(62) Division of application No. 11/689,415, filed on Mar. 21, 2007, now Pat. No. 7,436,191.

(51) Int. Cl.
  *G01R 31/02*    (2006.01)
(52) U.S. Cl. ............... 324/754; 324/761; 324/158.1
(58) Field of Classification Search .......... None
  See application file for complete search history.

(56) References Cited

U.S. PATENT DOCUMENTS

| | | |
|---|---|---|
| 4,739,259 A | 4/1988 | Hadwin |
| 4,822,956 A | 4/1989 | Sepe |
| 4,923,407 A | 5/1990 | Rice |
| 5,196,789 A | 3/1993 | Golden |
| 6,452,406 B1 | 9/2002 | Beaman |
| 6,498,506 B1 | 12/2002 | Beckous |
| 6,722,898 B2 | 4/2004 | Peloza |
| 6,734,689 B1 * | 5/2004 | Yang ................ 324/754 |
| 6,828,768 B2 | 12/2004 | McTigue |
| 6,949,919 B1 | 9/2005 | Cannon |
| 7,102,370 B2 * | 9/2006 | Cannon et al. ........... 324/754 |
| 7,126,366 B2 * | 10/2006 | Ohashi et al. ........... 324/765 |
| 7,262,614 B1 | 8/2007 | Campbell |
| 2005/0237078 A1 | 10/2005 | Cannon |

* cited by examiner

*Primary Examiner*—Vinh P Nguyen
(74) *Attorney, Agent, or Firm*—William K. Bucher

(57) ABSTRACT

A differential measurement probe has a ground clip system for electrically coupling outer shielding conductors of differential probing tips together. In one embodiment, the probing tips independently move vertically relative to each other with the ground clip system secured to each of the outer shielding conductors of the probing tips. In a further embodiment, the probing tips move both vertically and horizontally and the ground clip system has a spring wire member that is secured to the probe. The spring wire member is formed with various sections having various angles to each other that allows one section to slidably engage one of the outer shielding conductors on one of the probing tips and another section to slidably engage the outer shielding conductor of the other probing tip.

2 Claims, 6 Drawing Sheets

DIFFERENTIAL MEASUREMENT PROBE HAVING A GROUND CLIP SYSTEM FOR THE PROBING TIPS

CROSS-REFERENCE TO RELATED APPLICATION

This divisional application claims the benefit of priority of divisional U.S. patent application No. 11/689,415, filed Mar. 21, 2007, now U.S. Pat. No. 7,436,191, which claim the benefit of priority of the U.S. patent application No. 11/139,315, filed May 27, 2005 now abandoned.

BACKGROUND OF THE INVENTION

The present invention related generally to differential measurement probes and more particularly to a differential measurement probe having ground clip system for probing tips that move axially and/or laterally relative to each other.

Differential measurement probe have first and second probing tip extending from a probe body for acquiring differential signals from a device under test or for acquiring a single signal with the second probing tip connected to a ground node of the test device. As the speed of electronic signal increases, inductive and capacitive effects that were negligible at lower bandwidths become increasing important. Inductive ground loops are one effect that can limit the bandwidth of a differential measurement probe. As the bandwidth of differential measurement probes approach 20 GHz, there is a need to reduce inductive ground loops as much as possible.

In a related application, the increasing speeds of electronic signals has resulted in the need for transmission line structures in printed circuit board (PCB) designs. To optimize high performance PCB designs for high speed applications, smooth transmission line structures are need to link communications between components. Time domain reflectometry (TDR) probes launch a rising or falling edge signal onto transmission line structures on a printed circuit board and acquire the return signal from the transmission line structures for determining parameters of the transmission lines. For example, the verifying the integrity of a transmission line structure can be determined using a TDR probe and a sampling oscilloscope.

Although instruments for differential TDR measurements are in existence, the limitations of commercially available TDR probes has resulted in PCB manufacturers having to rely upon test structures laid out on test coupons that are placed along the periphery of the PCB flat for PCB transmission line impedance control measurements. TDR data from the test coupon is used for determining lot quality for accepting or rejecting the circuit boards. This has lead to rejecting marginally good boards and allowing marginally bad boards because the test coupon may be far away from the actual transmission lines of interest. Correlation studies between system speed and transmission line designs are typically based on the test coupon results. Because of the difficulty in controlling the laminate layer thicknesses, the dielectric constant variations, metal line photo edge definitions and the copper etching over large board areas, there is usually sizable variations in the impedance of transmission lines depending on the their board location. The non-uniformity between transmission lines is typically on the order of ten percent. Due to these problems, correlation studies for high performance differential transmission lines to board impedance often requires large quantities of samples to reveal the true relationship.

Another problem a user encounter when performing differential TDR test is the need to provide a good ground for the two differential signal lines. Typically when performing differential signal measurements on a printed circuit board, a coplanar probe pad arrangement is required. The general probe pad arrangements are ground-signal-signal-ground (G-S-S-G) or a ground-signal-ground-signal-ground (G-S-G-S-G). This is a very restrictive requirement because the line spacing and line width of differential pairs are of may different varieties depending on the device pin pitch, PCB board materials, desired loss limit, and the like. A differential TDR probe has to be able to accommodate these different feature sizes.

An example of a TDR probe is the CP400-04, manufactured by Candox System of Japan. The probe has a metal housing in which an insulated signal conductor is disposed. The metal housing has a threaded connector at one end for connecting a signal cable. The other end of the housing has apertures for receiving spring action pogo pins. One pogo pin is coupled to the insulated signal conductor and the other pogo pins are connected to the metal housing. The resulting probing tips have a GSG configuration with 2.5 millimeter center-to-center spacing between the pogo pins.

A further example is the A0131688 TDR Probe, manufactured and sold by Inter-Continental Microwave, Santa Clara, Calif. The TDR probe has a metallic housing with one end of the housing having a threaded connector for connecting a signal cable. A substantially rectangular member extends outward from below the connector and has a threaded aperture for receiving a screw that secures the TDR probe to the flat spring when the TDR probe is configured with a similar probe for differential TDR applications. Below the rectangular member is a circular portion that transitions into a narrow rectangular probe tip member. The probe tip member has an aperture that receives an RF pin and dielectric member. The RF pin is electrically connected to a central signal contact of the treaded connector. Additional apertures are formed in the narrow rectangular probe tip member for receiving ground pogo pins. The various apertures allow the ground pogo pins to be positioned at various distances from the RF pin. The resulting probing tip has a GSG configuration.

Two A0131688 TDR Probes are used to produce the A0134332 Differential TDR probe, manufactured and sold by Inter-Continental Microwave, Santa Clara, Calif. The individual TDR probes that are mounted to a flat spring using two screws. A variable spacing adjustment clamp is position over the TDR probes adjacent to the narrow rectangular probe tip members. The adjustment clamp has a "U" shaped portion and a flat portion with the two portions being secured together with screws. The two opposing sides of the "U" shaped member have threaded apertures that receive adjustment cap screws that extend through the sides of the "U" shaped member and into interior space of the "U". Treaded apertures are formed in the base of the "U" shaped member that intersect the threaded apertures in the opposing sides of the "U" shaped member. Each threaded aperture in the base receives a set screw that is tightened on the adjustment cap screws.

Positioning of the RF pins are accomplished by loosening the set screws on the adjustment cap screws and turning the adjustment cap screws to move each TDR probes closer together or farther apart. The flat spring to which the TDR probes are attached causes outward pressure on the probes to force them against the adjustment cap screws. The screws holding the TDR probes to the flat spring may also be loosened to allow rotational movement of the probes. When the RF tip and the ground pogo pins are positioned correctly, the set screws and the flat spring screws are tightened.

U.S. Pat. No. 6,734,689 describes a measurement probe providing signal control for an EOS/ESD protection control module. The measurement probe has a spring loaded coaxial probe assembly and a pressure sensor that work in combination to provide an activation signal to the control module. The control module is coupled to a TDR module in a sampling oscilloscope that provides the rising or falling edge signal to the DUT and samples the return signal from the DUT. The spring loaded coaxial cable assembly and pressure sensor are disposed in a probe housing. The spring loaded coaxial probe assembly has a semi-rigid coaxial cable with one end forming a probing tip and the other end having a threaded connector. A flexible coaxial cable is connected to the threaded connector and to the control module. A ground probing tip is disposed adjacent to the probing tip and is electrically coupled to the outer shielding conductor of the semi-rigid coaxial cable. The ground probing tip is a retractable, spring loaded probing tip that is attached to a slotted collar that fits around outer shielding conductor of the semi-rigid coaxial cable. The resulting probe has a GS configuration.

What is needed is a differential measurement probe that reduces inductive ground loops for achieving a 20 GHz probe bandwidth. Further, there is a need for a variable spacing differential TDR probe that is not limited to existing ground-signal-ground configurations. The variable spacing differential TDR probe should be provided with a ground clip system that couples the outer shielding conductors of the coaxial probing tips together during all possible axial and lateral movements of the coaxial probing tips.

SUMMARY OF THE INVENTION

Accordingly, the present invention is a differential measurement probe having first and second probing tip assemblies disposed within a housing. Each of the first and second probing tip assemblies have a probing tip extending from one end of the housing with each probing tip assembly having a probing contact and an outer shielding conductor coupled to a probe ground. A ground clip is coupled between the outer shielding conductors of the first and second probing tips adjacent to the probing contacts of the first and second probing tips.

On one embodiment of the differential measurement probe, each of the probing tip assemblies has at least a first compressible element disposed within the housing for allowing independent axial movement of the first and second probing tip assemblies. In a further embodiment, the differential measurement probe has at least a first adjustment mechanism coupled to one of the first and second probing tip assemblies for varying the distance between the probing tips of the first and second probing tip assemblies.

In a further embodiment, a ground clip system electrically couples the shielding conductors of first and second measurement probing tips together in a differential measurement probe. The measurement probing tip extend from one end of the differential measurement probe and lay in a common vertical plane with the first and second measurement probing tips move axially and laterally relative to each other. The ground clip system has a circular spring wire having a lateral section that transitions into a vertical section at one end and an angled section at the other end. The angled section extends in the opposite direction from the vertical section and has an obtuse angle to the lateral section. In a first embodiment, the lateral, vertical and angled sections of the circular spring wire are in the same plane. A protruding section extends upward from the end of the angled section with the protruding section having an acute angle to the to the plane of the lateral, vertical and angled sections. A flattened wire section extends from the end of the protruding section with the flattened section extending toward the plane of the lateral, vertical and angled sections of the circular spring wire. The flattened section has an obtuse angle relative to the lateral section of the circular spring wire and an acute angle relative to the plane of the lateral, vertical and angled sections of the circular spring wire.

An angled bore is formed in the end of the differential measurement probe and receives the vertical section of the circular spring wire. The angle of the bore extends toward the common vertical plane of the first and second measurement probing tips. A protrusion having side surfaces extends upward from the end of the differential measurement probe adjacent to one of the measurement probing tips. The end of the lateral section of the circular spring wire adjacent to the angled section of the circular spring wire abuts the surface of the protrusion facing the measurement probing tip. The junction of the angled section and the protruding section of the circular spring wire engages one of the shielding conductors of the first and second measurement probing tips and the flattened portion of the circular spring wire engages the shielding conductor of the other of the first and second measurement probing tips.

In the preferred embodiment, the transition between the lateral and vertical sections of the circular spring wire is substantially ninety degree. The obtuse angle between the lateral and angled sections of the circular spring wire has a range of ninety-two and ninety-six degrees. The angle between the protruding section of the circular spring wire and the plane of the lateral, vertical and angled sections of the circular spring wire has a range of thirty-five to sixty-five degrees. The protruding section of the circular spring wire has an inside length of 0.010 inches. The flattened section of the circular spring wire has a thickness in the range of 0.004 inches to 0.007 inches. The obtuse angle of the flattened section of the circular spring wire to the lateral section of the circular spring wire is in the range ninety-two to ninety-five degrees. The acute angle of the flattened section of the circular spring wire to the relative to the plane of the lateral, vertical and angled sections of the circular spring wire lateral section of the circular spring wire is in the range eight to fifteen degrees. The angle of the bore extending toward the common vertical plane of the first and second measurement probing tips is twenty degrees.

In a further embodiment of the invention, the lateral section defines a plane and at least one of the vertical section and the angled section of the circular spring wire is at an acute angle to the lateral section plane. The bore formed in the end of the differential measurement probe is parallel to the common vertical plane of the first and second measurement probing tips and receives the vertical section of the circular spring wire. In one implementation, the acute angle of the vertical section of the circular spring wire is at twenty degrees to the lateral section plane. In another implementation, the acute angle of the angled section of the circular spring wire is at twenty degrees to the lateral section plane. In a further embodiment, the vertical section of the circular spring wire and the angled section of the circular spring wire are angled to the lateral section plane with the total angle of the vertical section of the circular spring wire and the angled section of the circular spring wire being at twenty degrees to the lateral section plane.

The objects, advantages and novel features of the present invention are apparent from the following detailed description when read in conjunction with appended claims and attached drawings.

DETAILED DESCRIPTION OF THE PREFERRED EMBODIMENT

Figure 1:
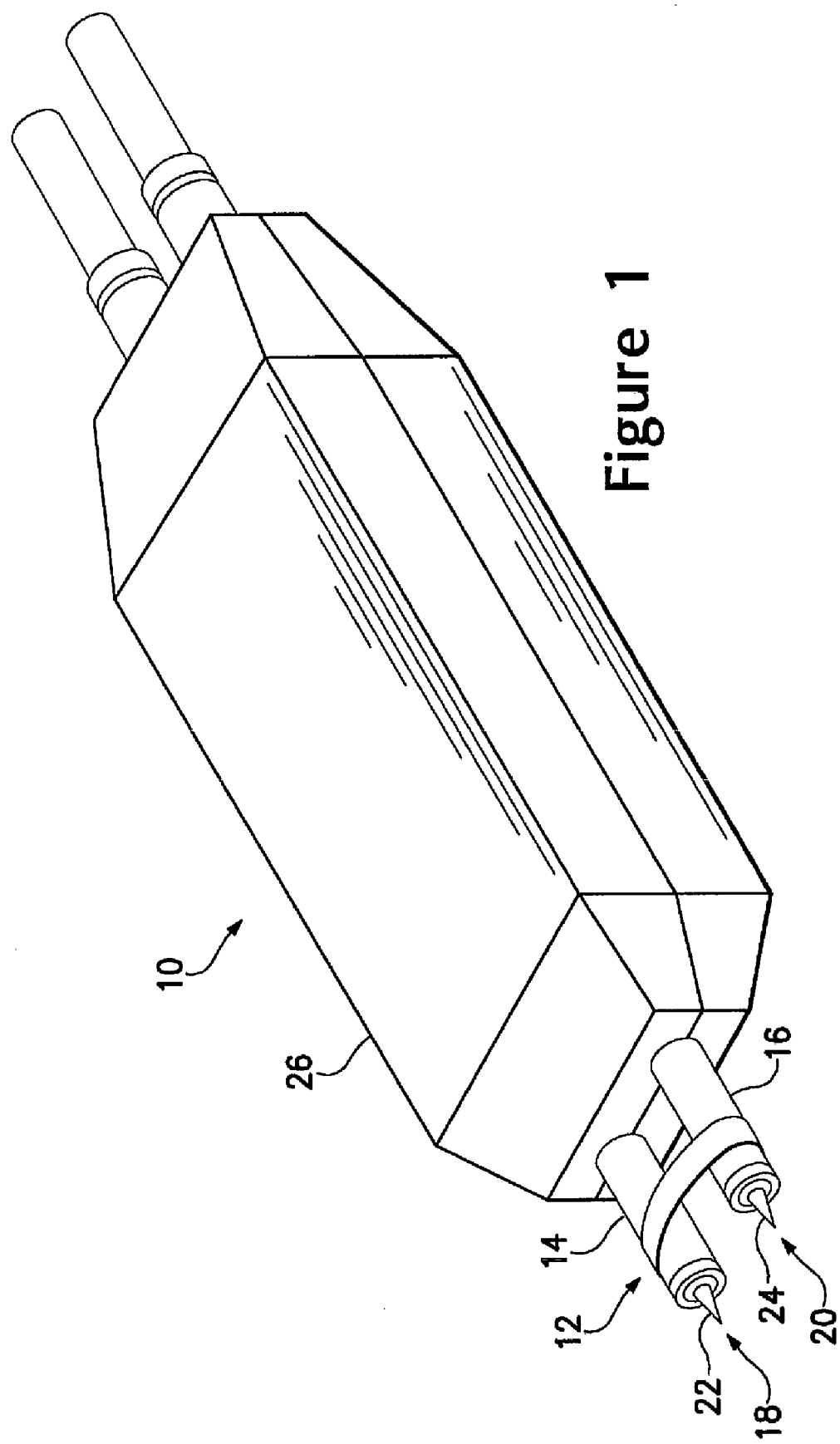
FIG. 1 is a perspective view of a differential measurement probe having a ground clip system according to the present invention.
Figure 2:
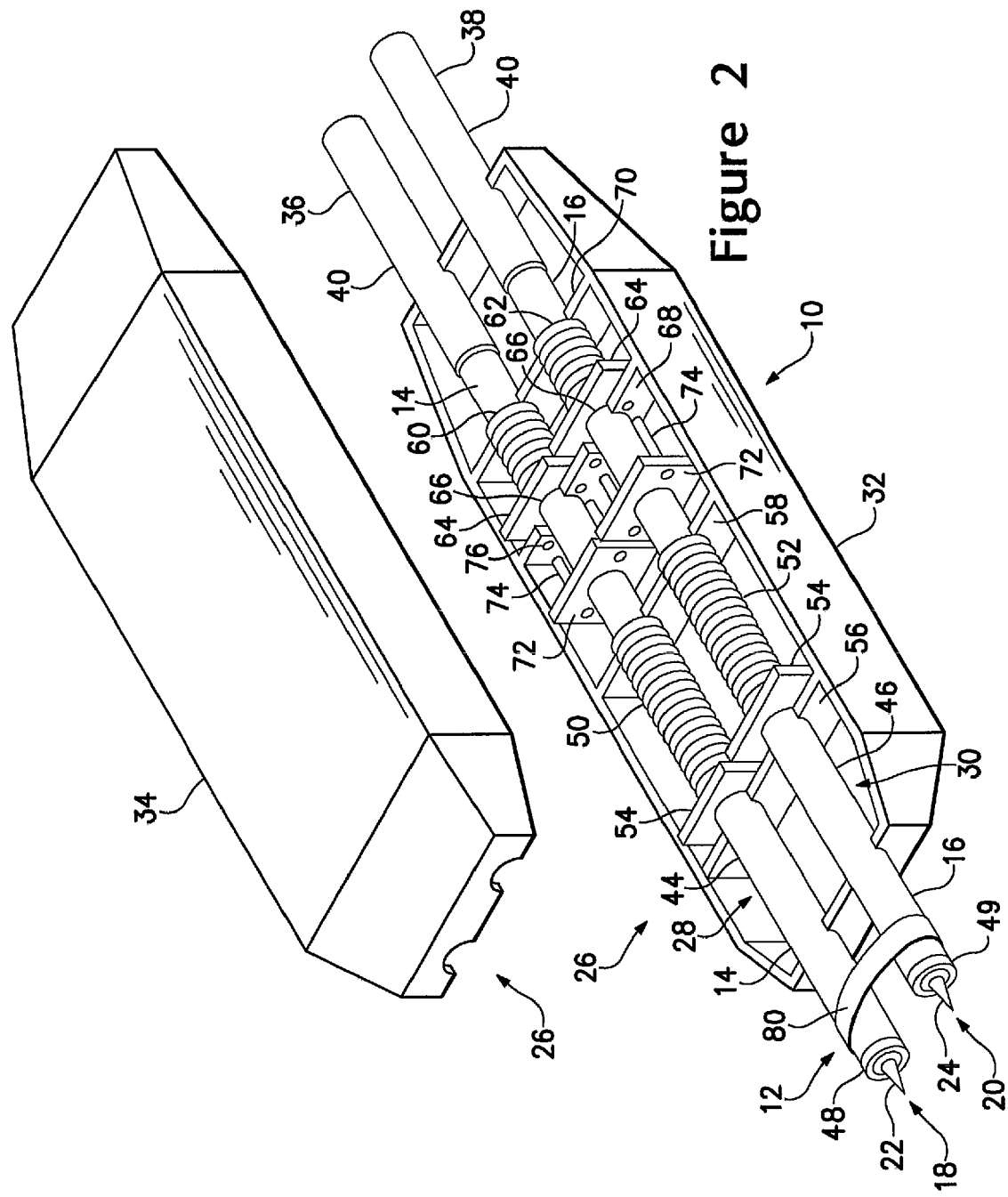
FIG. 2 is a partially exploded perspective view of the differential measurement probe having a ground clip system according to the present invention.

Referring to FIG. 1, there is a perspective view of a differential measurement probe 10 having a ground clip system 12 coupled to outer shielding conductors 14, 16 of probing tips 18, 20. Each probing tip 18, 20 has a probing contact 22, 24 centrally disposed in the probing tip 18, 20. The probing tips 18, 20 extend outward from a housing 26. The differential measurement probe 10 may be part of a measurement probing system such as described in co-pending U.S. patent application Ser. No. 11/139,103, filed concurrently herewith and incorporated by reference. The measurement probing system includes a probe body electrically coupled to a measurement test instrument, such as an oscilloscope or the like, via a coaxial cable. The coaxial cable also contains power and signal lines that provide electrical power to active circuitry in the probe body and communication signals to and from the probe body for controlling the active circuitry. Two coaxial cables extends from the probe body through an inverted strain relief and is coupled to a differential measurement probe 10. The probing tips 18, 20 are part of first and second probing tip assemblies 28, 30 disposed in the housing 26 as best shown by the partially exploded perspective view of FIG. 2.

The housing 26 has first and second housing members 32, 34 formed of an insulating material, such as ABS plastic, polycarbonate, or the like. The probing tip assemblies 28, 30 may be formed from flexible semi-rigid coaxial cables 36, 38, such as manufactured and sold by Tensolite, Corp., St. Augustine, Fla., under the trade name Semi-Flex®. The Semi-Flex has a central signal conductor and an tightly braised outer shielding conductor formed of an electrically conductive material that is covered with an insulating material 40. A portion of the outer insulating material 40 is removed from the cables 36, 38 and the exposed braided portions of the outer shielding conductors are dipped in a liquid solder. The solder flows into the braids and stiffen those portions of the cables to form an unbending semi-rigid coaxial cables 44, 46. The unbending semi-rigid coaxial cables 44, 46 forms the probing tip assemblies 28, 30 with the solid outer shielding conductors forming the outer shielding conductors 14, 16 of the probing tip assemblies 28, 30. The probing contacts 22, 24 of the probing tips 18, 20 are preferably secured to respective resistive elements 48, 49 that are electrically coupled to the center signal conductors of the semi-rigid coaxial cables 44, 46. In a further embodiment, the semi-rigid coaxial cables 44, 46 may traditional semi-rigid coaxial cables having solid outer shielding conductors. The outer shielding conductors 14, 16 of the semi-rigid coaxial cables are coupled to electrical ground through the electrical circuitry of the probe body.

The first and second probing tip assemblies 28, 30 have first compression springs 50, 52 positioned on the respective semi-rigid coaxial cables 44, 46. One end of each of the first compression springs 50, 52 are fixedly positioned on the semi-rigid coaxial cables 44, 46. In one implementation, the spring ends abut respective retention plates 54 that are secured to the outer shielding conductors 14, 16 of the semi-rigid coaxial cable 44, 46. The opposing side of the retention plate 54 abuts a transverse wall 56 in the housing 26. The other ends of the first compression springs 50, 52 abut a transverse wall 58 such that the first compression springs 50, 52 are compressed between the transverse walls 56 and 58.

The first and second probing tip assemblies 28, 30 have second compressive springs 60, 62 positioned on the semi-rigid coaxial cables 44, 46. One end of each of the second compression springs 60, 62 abut respective pressure plates 64 having bores 66 there through for positioning the pressure plates 64 around the semi-rigid coaxial cable 44, 46. The pressure plates 64 are free to move along the semi-rigid coaxial cables 44, 46. The pressure plates 64 abut a transverse wall 68. The other ends of the second compression springs 60, 62 abut a transverse wall 70 such that the second compression springs 60, 62 are compressed between the transverse walls 68, 70. Actuators 72 are fixedly positioned on the outer shielding conductors 14 of the semi-rigid coaxial cables 44, 46 with the actuators having protrusions 74 extending toward the pressure plates 64. The protrusions 74 of the actuators 72 pass through apertures 76 formed in the transverse wall 68 and engage the pressure plates 64 during movement of the housing 26 relative to the probing tip assemblies 28, 30. The first and second compressible springs 50, 52, 60, 62 allow independent axial movement of the probing tip assemblies 28, 30 within the housing 26 during use.

The ground clip system 12 may be formed of a flexible braided copper 80 that is plated with silver. The silver plated braided copper 80 is secured to the outer shielding conductors 14, 16 of probing tips 18, 20 using solder, electrically conductive epoxy or the like. The silver plated braided copper 80 has sufficient length and flexibility to allow the maximum travel of the independently movable probing tip assemblies 28, 30 within the housing 26.

Figure 3:
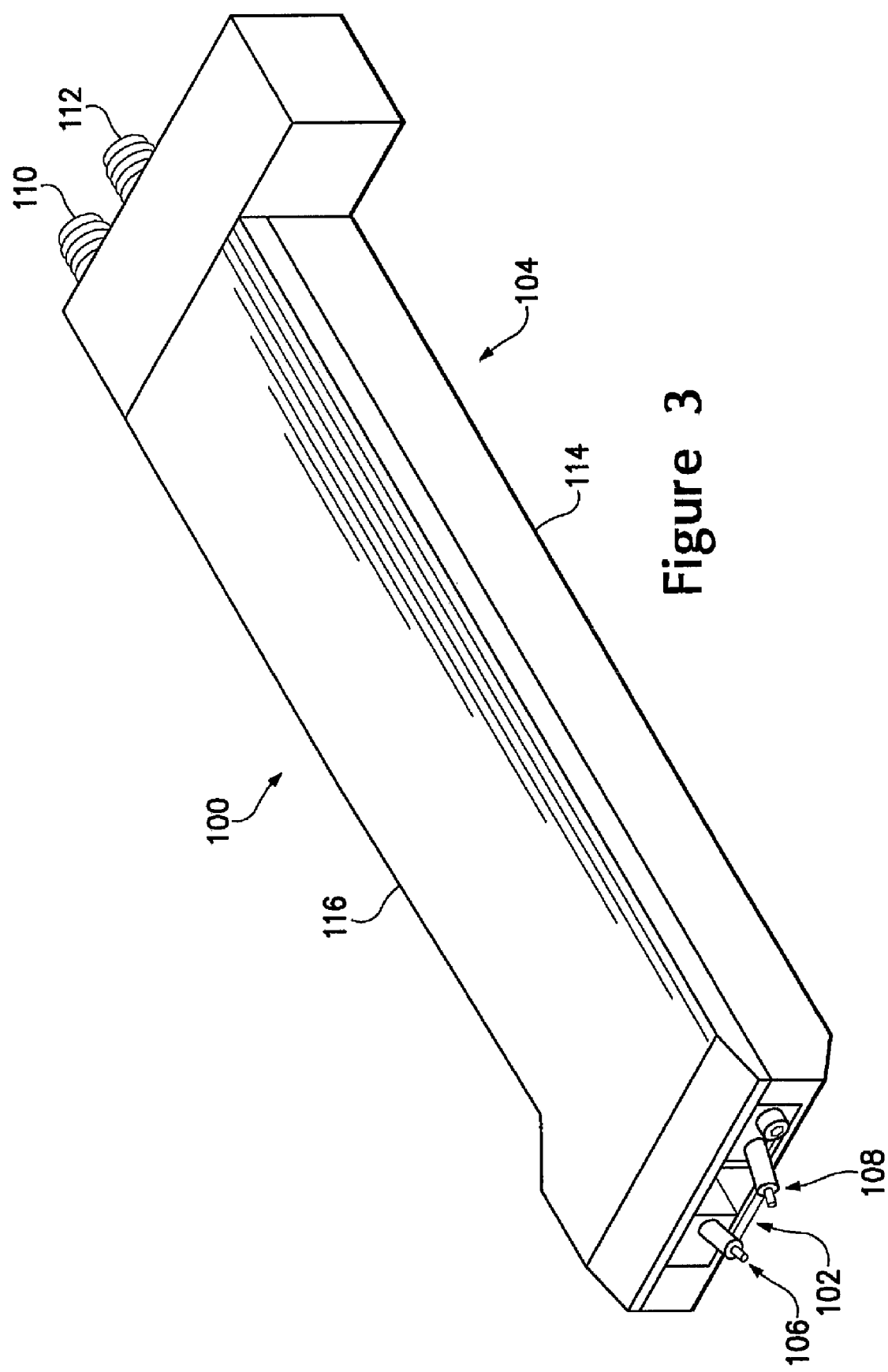
FIG. 3 is a perspective view of a differential TDR measurement probe having a ground clip system according to the present invention.

Referring to FIG. 3, there is shown a perspective view of a differential TDR measurement probe 100 incorporating the ground clip system 102. The TDR measurement prob 100 has a housing 104 in which are disposed first and second probing tip assemblies to be described in greater detail below. The housing 104 is preferably elongate with a predominate rectangular cross-section and made of first and second member 114 116. The housing 104 is formed of an insulating material, such as ABS plastic, polycarbonate, or the like. Extending from one end of the housing 104 are probing tips 106, 108. Extending from the far end of the housing are coaxial threaded connectors 110, 112 that are coupled to flexible coaxial cables (not shown). The coaxial cables connect the differential TDR measurement probe 100 to first and second control modules (not shown) providing electrical overstress (EOS) and electrostatic discharge (ESD) protection. The first and second control modules couple the signals from the differential TDR measurement probe 100 to a TDR sampling module in a sampling oscilloscope (not shown).

Figure 4:
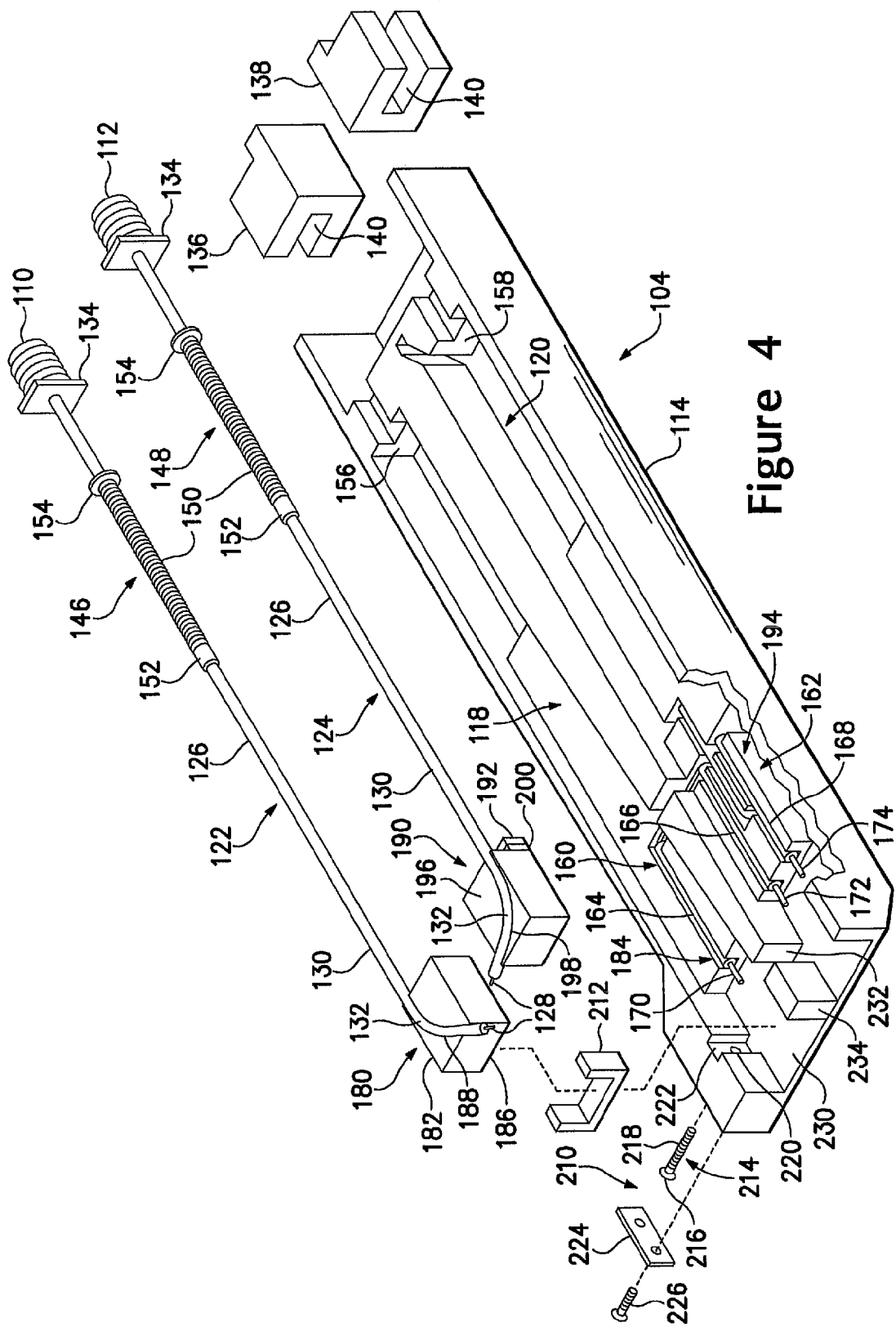
FIG. 4 is a partially exploded view of the differential TDR measurement probe having a ground clip system according to the present invention.

Referring to FIG. 4, the housing member 114 has first and second channels 118, 120 for receiving the first and second coaxial probe assemblies 122, 124. Each of the coaxial probe assemblies 122, 124 has a semi-rigid coaxial cable 126 having a central signal conductor 128 and an outer shielding conductor 130. The central signal conductors 128 extend outward past the outer shielding conductors 130 at one end to form the probing tips 106, 108. The semi-rigid coaxial cables 126 have curved portions 132 at the probing tip ends 106, 108 that transitions to straight portions at the probing tips 106, 108. The coaxial threaded connectors 110, 112 are attached to the other ends of the semi-rigid coaxial cables 126. The threaded portions of the coaxial threaded connectors 110, 112 are coupled to the outer shielding conductors 130 and the central signal conductors 128 are coupled to respective central conductors axially disposed within the coaxial threaded connectors 110, 112. The outer shielding conductors 130 of the semi-rigid coaxial cables 126 are capable of being coupled to electrical ground through the flexible coaxial connectors 110, 112 being coupled to the flexible coaxial cables that are connected to the first and second control modules in the sampling oscilloscope. Attachment plates 134 are attached to the outer shielding conductors 130 adjacent to the coaxial threaded connectors 110, 112. Abutting the attachment plates 134 on the side away from the coaxial threaded connectors 110, 112 are anti-rotation block 136, 138. Each anti-rotation block 136, 138 has a channel 140 formed therein that accepts one of the semi-rigid coaxial cables 26. The anti-rotation blocks 136, 138 have threaded apertures that receive threaded screws passing through apertures formed in the attachment plates 134 for securing the anti-rotation blocks 136, 138 to the attachment plates 134.

The first and second coaxial probe assemblies 122, 124 have first compressive elements 146, 148 in the form of compression springs 150 positioned on the semi-rigid coaxial cables 126. One end of the compression springs 150 are preferably held in place on the semi-rigid coaxial cables 126 by a compression spring retention members 152 secured to outer shielding conductors 130 of the semi-rigid coaxial cables 126. The other ends of the compression springs 150 are free to move along the semi-rigid coaxial cables 126. A pressure plate 154 in the form of a washer is preferably positioned adjacent to each of the free ends of the compression springs 150 for engaging the rearward end walls 156, 158 of the channels 118, 120. The first and second coaxial probe assemblies 122, 124 have respective second compressive elements 160, 162 in the form of compression springs disposed within pogo pins 164, 166, 168. The compression springs are partially compressed in the pogo pins 164, 166, 168 by the movable electrical contacts 170, 172, 174 of the pogo pins.

The first coaxial probe assembly 122 has a first pressure sensor 180 that includes first and second electrically conductive contacts 182 and 184. The first electrically conductive contact 182 is positioned on the semi-rigid coaxial cable 126 and the second electrically conductive contact 184 is positioned in the housing member 1114. The electrically conductive contact 182 preferably takes the form of a rectangular shaped retention block 186 having a curved slot 188. The curved portion 132 of the semi-rigid coaxial cable 126 of the first coaxial probe assembly 122 is disposed in the curves slot 188 of the retention block 186 and makes electrical contact with the retention block 186. The retention block 186 is preferably made of an electrically conductive material, such as copper, brass, or the like, that is plated with gold. The second electrically conductive contact 184 is the pogo pin 164 of the second compressive element 160 of the first coaxial probe assembly 122.

The second coaxial probe assembly 124 has a second pressure sensor 190 that includes first and second electrically conductive contacts 192 and 194. The first electrically conductive contact 192 is positioned on a rectangular shaped retention block 196 having a curved slot 198. The curved portion 132 of the semi-rigid coaxial cable 126 of the second coaxial probe assembly 124 is disposed in the curves slot 198 of the retention block 196 and makes electrical contact with the retention block 196. The retention block 196 is preferably made of an electrically conductive material, such as copper, brass, or the like, that is plated with gold. An electrically insulating material 200 is disposed between the electrically conductive contact 192 and the retention block 196 to electrically isolate the contact 192 from the coaxial probe assembly 126. The second electrically conductive contact 194 of the second pressure sensor 190 is the two pogo pins 166, 168 of the second compressive element 162 of the second coaxial probe assembly 124.

The differential TDR measurement probe 100 has an adjustment mechanism 210 that moves the first coaxial probe assembly 122 relative to the second coaxial probe assembly 124 which, in turn, varies the spacing between the probing tips 106, 108. The adjustment mechanism has a carrier 212 closely receiving the retention block 186 of the first coaxial probe assembly 122. The carrier 212 is preferably a "U" shaped member having a threaded aperture formed therein for receiving a threaded cap screw 214 having a cap head 216 and the threaded shank 218. The threaded cap screw 214 is inserted in a bore 220 of the housing member 114 with the threaded shank 218 extending into a recess 222 of the channel 118 and screwing into the carrier 212. The cap head 216 of the cap screw 214 sits in a recess formed in the outer surface of the housing member 114. A cap plate 224 fits over this recess and is held in place with a screw 226 that is screwed into the housing member 114. The cap plate 224 closely captures the cap head 216 between the housing member 114 and the cap plate 224 so that there is no axial movement of the cap head 216 in the recess.

The retention block 186 frictionally fits in the "U" shaped carrier 212 so that there is no lateral play of the retention block 186 in the carrier 212. The carrier 212 is positioned in a recess 230 of the channels 118 of the housing member 114 and moves laterally across the recess 230 in response to the turning of the cap screw 214. Turning the cap screw 214 clockwise generates pressure to the bottom surface of the cap head 216 by the housing member 114 causing the carrier 212 to move outward towards the side of the housing member 114. Turning the cap screw 214 counter clockwise generates pressure on the top of the cap head 216 by the cap plate 224 causing the carrier 212 to move inward toward the center of the housing member 114. The carrier 212 can retract into the recess 222 formed in the wall of the housing member 114 until the retention block 186 abuts the outer side wall of the recess 230. The carrier 212 can be extended across the recess 230 until the retention block 186 abuts the inner side wall of the of the recess 230 with a portion of the carrier 212 moving into a slot 232 formed in the dividing wall 234 between the channels 118 and 120.

Placing the probing tips 106, 108 on a transmission line structure on a printed circuit board and applying downward pressure on the housing 104 applies downward forces on the probing tips 106, 108 by the first compression springs 150 being compressed by the rearward end walls 156, 158 of the channels 118, 120 in the housing 104. At the same time, the probing tips 106, 108 begin to retract into the housing 104. Continued downward pressure on the housing 104 causes the probing tips 106, 108 to continue to retract in the housing and the pogo pins 164, 166, 168 of the second electrically conductive contacts 184, 194 of the first and second pressure sensors 180 and 190 to engage the first electrically conductive contacts 182, 184 of the first and second pressure sensors 180, 190. The making of the contacts of the first and second pressure sensors 180, 190 passes an activation signal to the control modules which activates a relay to couple the probing tips 106, 108 to the TDR sampling module. At the same time, the compression springs in the pogo pins 164, 166, 168 apply additional downward forces to the probing tips 106, 108. The use of the first and second compressive elements 146, 148, 160, 162 with the first and second coaxial probe assemblies 122, 124 allows the assemblies to move independently of each other.

Figure 5:
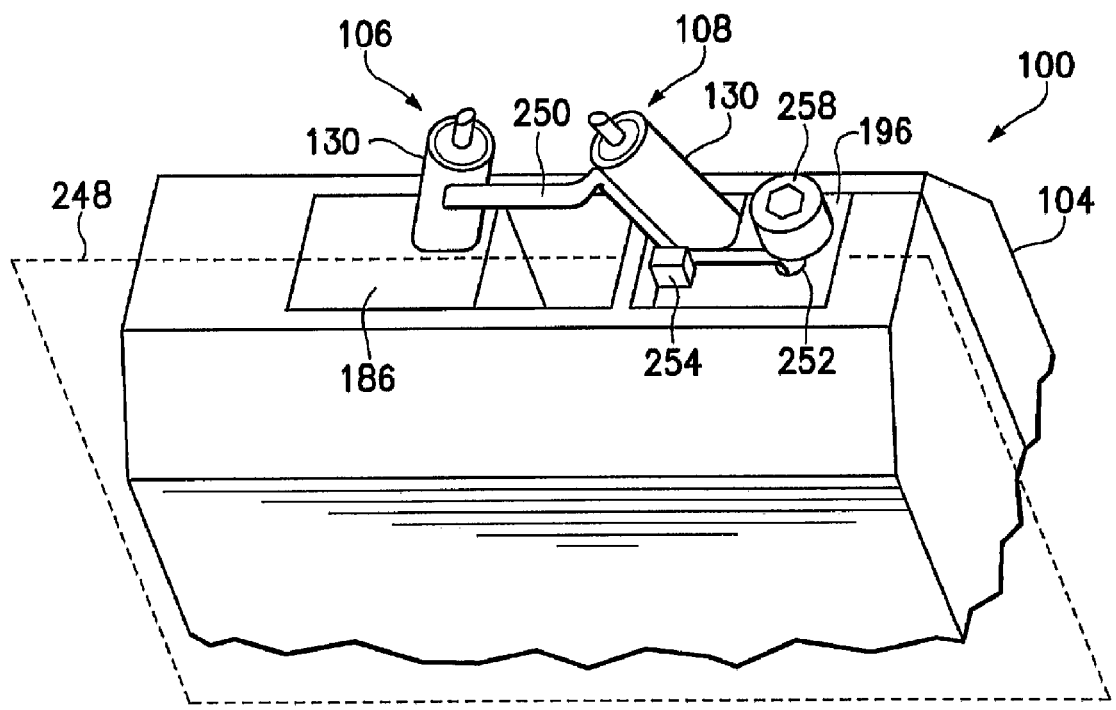
FIG. 5 is close-up perspective view of the front end of the differential TDR measurement probe having a ground clip system according to the present invention.
Figure 6:
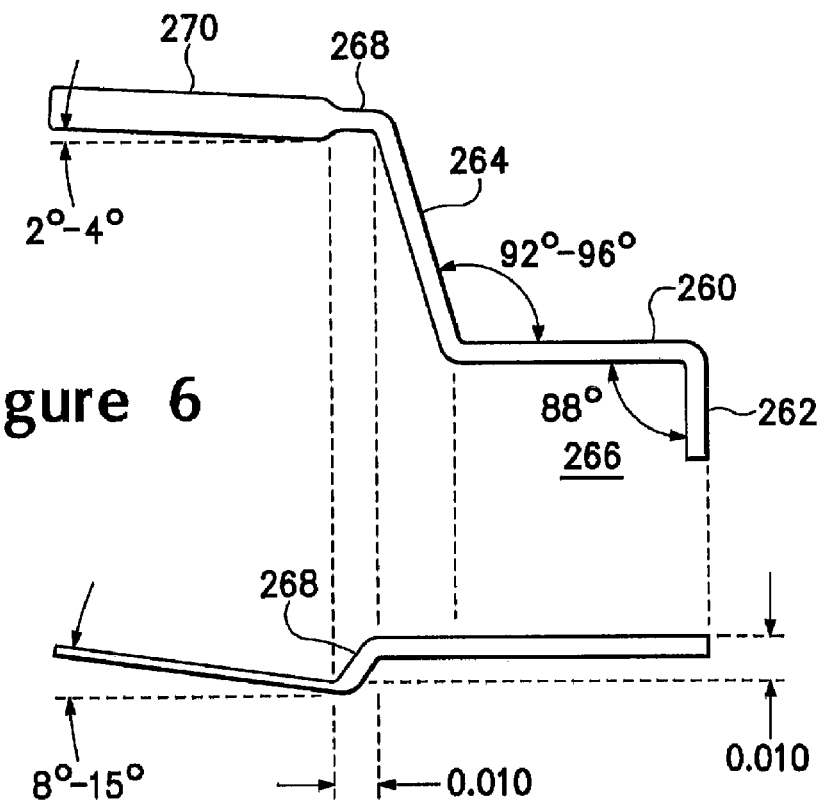
FIG. 6 is a side view and a plan view of the spring wire member of the ground clip system according to the present invention

Referring to FIG. 5, there is a close-up perspective view of the front end of the differential TDR measurement probe 100 showing the ground clip system 92. The probing tips 106, 108 lay in a common plane 248 that is normal to the front end of the differential TDR measurement probe 100. The ground clip system 92 has a spring wire member 250, a bore 252 formed in the end of the differential TDR measurement probe 100, and a protrusion 254 extending from the end of the differential TDR measurement probe 100. In the preferred embodiment, the bore 252 and the protrusion are formed in the retention block 196 of the second coaxial probing assembly 124. The bore 252 is preferably angled toward the probing tip 108 at twenty degrees but other angles may be employed so long as the spring wire member maintains contact with the outer shielding conductors 130 of the probing tips 106, 108 at all times. A threaded bore is formed in the retention block 196 for receiving a cap screw 258 for securing the spring wire member 250 to the differential TDR measurement probe 100. The spring wire member 250 has various angled bends and a flat portion formed therein for allowing the spring wire member 250 to contact the outer shielding conductors 130 of the probing tips 106, 108 at any spacing between the probing tips 106, 108.

Referring to FIG. 5, there is a close-up perspective view of the front end of the differential TDR measurement probe 100 showing the ground clip system 102. The probing tips 106, 108 lay in a common plane 248 that is normal to the front end of the differential TDR measurement probe 100. The ground clip system 102 has a spring wire member 250, a bore 252 formed in the end of the differential TDR measurement probe 100, and a protrusion 254 extending from the end of the differential TDR measurement probe 100. In the preferred embodiment, the bore 252 and the protrusion are formed in the retention block 196 of the second coaxial probing assembly 124. The bore 252 is preferably angled toward the probing tip 108 at twenty degrees but other angles may be employed so long as the spring wire member maintains contact with the outer shielding conductors 130 of the probing tips 106, 108 at all times. A threaded bore is formed in the retention block 196 for receiving a cap screw 258 for securing the spring wire member 250 to the differential TDR measurement probe 100. The spring wire member 250 has various angled bends and a flat portion formed therein for allowing the spring wire member 250 to contact the outer shielding conductors 130 of the probing tips 106,108 at any spacing between the probing tips 106, 108.

Extending from the end of the angled section 264 is a protruding section 268 and a flattened section 270. The protruding section 268 extends outward from the plane 266 at an nominal angle of approximately forty-five degrees. The protruding section 268 has a nominal inside dimension of 0.010 inches for probing tips 106, 108 having a diameter of 0.085 inches. The inside dimension of the protruding section 268 varies with the diameter of the probing tips 106, 108 with lager diameter probing tips 106, 108 requiring a larger inside dimension for the protruding section 268. The flattened section 270 extends from the protruding section 268 and is angled toward the common plane 266 of the lateral section 260, the substantially vertical section 262 and the angled section 264. The angle of the flattened section 270 relative to the common plane 266 has a range of eight to fifteen degrees with the nominal angle being eight degrees. The flattened section 270 further has an obtuse angle relative to the lateral section 260 that ranges from two to four degrees with the nominal angle being two degrees. The flattened section 270 has a thickness ranging from 0.0045 to 0.0060 inches and an overall nominal length of 0.260 inches. The flattening of the beryllium-copper wire lowers the spring constant of that flattened section 270 of the wire normal to the flat surface. This lowers the torsion force the flattened section 270 exerts on the junction 272 of the angled section 264 and the protruding section 268. After the spring wire member 250 is formed into the proper shape, it is heat treated at 600° F. for two hours to increase the hardness of the beryllium copper wire.

The substantially vertical section 262 of the spring wire member 250 is inserted into the angled bore 252 with the lateral section 260 laying flush with the surface of the retention block 196 and the end of the lateral section 260 adjacent to the angled section 264 positioned against the inside surface of the protrusion 254 adjacent to the probing tips 108. The junction 272 of the angled section 264 and the protruding section 268 abuts the outer shielding conductor 130 of the probing tip 108. Because of the twenty degree angle applied to the angled section 264 by the spring wire member 250 being inserted into the angled bore 252, the lateral section 260 has the tendency to spring outward from the probing tip 108. The protrusion 254 retrains the lateral section 260 from springing outward so as to maintain a strong spring force of the junction 272 on the outer shielding conductor 130 of the probing tip 108 as represented by the vector $F_1$ in FIG. 7.

Figure 7:
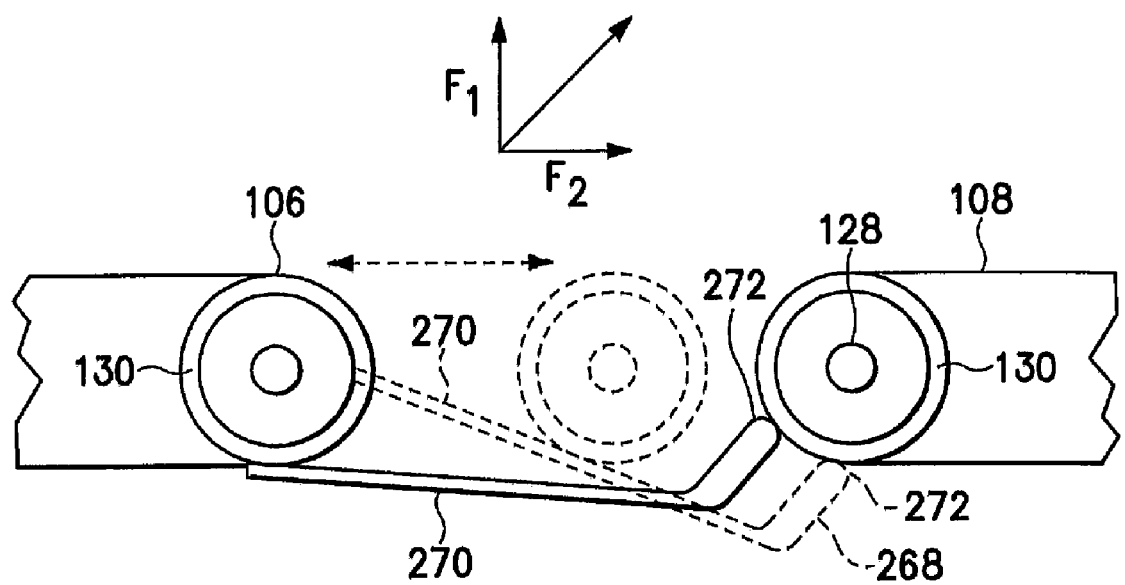
FIG. 7 is a simplified end view of the probing tip assemblies and a portion of the ground clip system according to the present invention.

FIG. 7 is a simplified end view of the probing tip assemblies 106, 108 looking toward the end of the differential TDR measurement probe 100. The probing tip 106 is movable relative to the probing tip 108 as represented by the doubled arrow dashed line. The flattened section 270 of the spring wire member 250 engages the outer shielding conductor 130 of the probing tip 106. When the probing tips 106, 108 are separated at their greatest distance from each other, the junction 272 of the angled section 264 and the protruding section 268 is positioned toward the probing tip 106 on the outer shielding conductor 130 of the probing tip 108. At the same time the obtuse angle between the lateral section 260 and the angled section 264 increases. The spring constant of the beryllium copper wire seeks to maintain the original obtuse angle which generates a force $F_2$ on the junction 272 as represented by the vector $F_2$. The resulting vector force on junction 272 is directed toward the central signal conductor 128 of the probing tip 108.

As the probing tip 106 is moved toward the probing tip 108, the junction 272 of the spring wire member 250 moves along the surface of the outer shielding conductor 130 of the probing tip 108 as represented by the dashed probing tips 106, the flattened section 270 and the protruding section 268. The flattened section 270 of the spring wire member 250 has a reduce spring constant compared to the circular portions of the spring wire member 250 due to the flattening process. Because of this, the torsional force applied by the flattened section 270 on the junction 272 is reduced. This results in the junction 272 maintaining a strong mechanical contact with the outer shielding conductor 130 of the probing tip 108. Without the reduced spring constant of the flattened section 270, the junction 272 would pull away from the outer shielding conductor 130 of the probing tip 108.

Figure 8A:
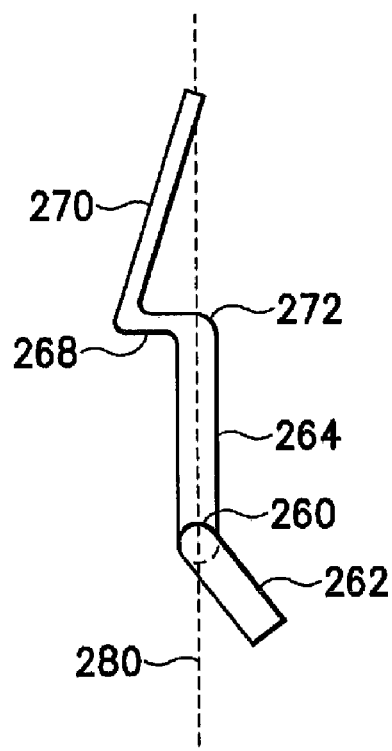
FIGS. 8A and 8B are side views of alternative configurations of the spring wire member in the ground clip system according to the present invention.
Figure 8B:
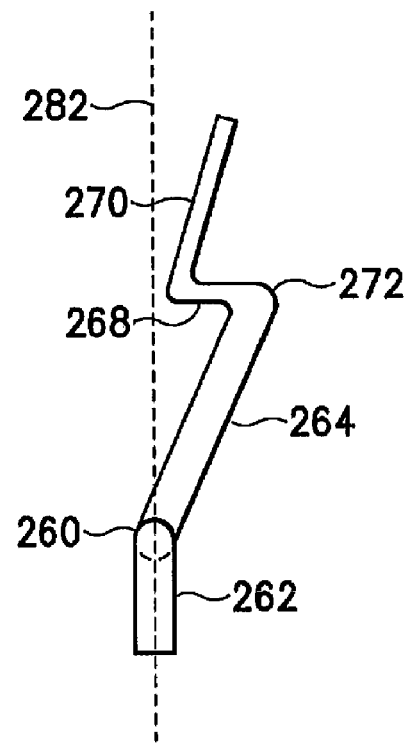

FIGS. 8A and 8B illustrates further embodiments of the ground clip system 102. Like elements from the previous drawings are labeled the same in FIGS. 8A and 8B. The views in FIGS. 8A and 8B are looking parallel to the lateral section 260. In FIG. 8A, the spring wire member 250 is modified so that the substantially vertical section 262 is angled relative to a common plane 280 containing the lateral section 260 and the angled section 264. The angle of the substantially vertical section 262 to the common plane 280 is nominally twenty degrees. The bore 252 in the retention block 196 is changed from an angled bore of twenty degrees to a vertical bore that is normal to the surface of the retention block 196. Alternately, the substantially vertical section 262 may have an angle of less than twenty degrees to the common plane 280 and the bore 252 may be angled at less than twenty degrees where the total angle of the substantially vertical section 262 and the angled bore 252 is twenty degrees.

In FIG. 8B, the spring wire member 250 is modified so that the angled section 264 is angled relative to a common plane 282 containing the lateral section 260 and the substantially vertical section 262. The angle of the angled section 264 to the common plane 282 is nominally twenty degrees. The bore 252 in the retention block 196 is changed from an angled bore of twenty degrees to a vertical bore that is normal to the surface of the retention block 196.

The differential measurement probe 10 and the differential TDR measurement probe 100 with the ground clip systems 12, 102 provide a virtual ground to the signals being measured by the probe. The use of the ground clip systems 12, 102 achieves greater bandwidth into the 20 GHz range than previous differential measurement probes.

It will be obvious to those having skill in the art that many changes may be made to the details of the above-described embodiments of this invention without departing from the underlying principles thereof. The scope of the present invention should, therefore, be determined only by the following claims.

What is claimed is:

1. In a differential measurement probe having first and second measurement probing tips extending from one end of the differential measurement probe and laying in a common vertical plane with the first and second measurement probing tips moving axially and laterally relative to each other, a ground clip system for electrically coupling shielding conductors of the first and second measurement probing tips together comprising:

a circular spring wire having a lateral section that transitions into a substantially vertical section at one end and an angled section at the other end with the angled section extending in the opposite direction from the substantially vertical section and having an angle to the lateral section with the lateral section and the angled section being in a common plane and the substantially vertical section having an acute angle relative to the common plane, and a protruding section extending upward from the end of the angled section with the protruding section having an acute angle to the to the common plane, and a flattened wire section extending from the end of the protruding section with the flattened section extending toward the common plane and having an obtuse angle relative to the lateral section of the circular spring wire and an acute angle relative to the lateral section plane;

an bore formed in the end of the differential measurement probe parallel to the common vertical plane of the first and second measurement probing tips receiving the substantially vertical section of the circular spring wire; and a protrusion having side surfaces extending upward from the end of the differential measurement probe adjacent to one of the measurement probing tips with the end of the lateral section of the circular spring wire adjacent to the angled section of the circular spring wire abutting the surface of the protrusion facing the measurement probing tip such that the junction of the angled section and the protruding section of the circular spring wire engages one of the shielding conductors of the first and second measurement probing tips and the flattened section of the circular spring wire engages the shielding conductor of the other of the first and second measurement probing tips.

2. The ground clip system as recited in claim 1 wherein the acute angle of the substantially vertical section of the circular spring wire is at twenty degrees to the common plane.

* * * * *